United States Patent
Wang et al.

(10) Patent No.: US 10,263,055 B2
(45) Date of Patent: Apr. 16, 2019

(54) PIXEL DEFINITION STRUCTURE, ORGANIC LIGHT-EMITTING DEVICE, ENCAPSULATION METHOD THEREOF, AND DISPLAY APPARATUS

(71) Applicant: BOE Technology Group Co., Ltd., Beijing (CN)

(72) Inventors: Youwei Wang, Beijing (CN); Song Zhang, Beijing (CN); Peng Cai, Beijing (CN); Ping Song, Beijing (CN); Xiaobo Du, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/834,144

(22) Filed: Dec. 7, 2017

(65) Prior Publication Data

US 2018/0315807 A1 Nov. 1, 2018

(30) Foreign Application Priority Data

Apr. 27, 2017 (CN) .......................... 2017 1 0289711

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5253* (2013.01); *H01L 51/5256* (2013.01);
(Continued)

(58) Field of Classification Search
CPC .. H01L 27/3246; H01L 51/56; H01L 51/5253
See application file for complete search history.

(56) References Cited

U.S. PATENT DOCUMENTS 7,948,168 B2 * 5/2011 Park ..................... H01L 27/3246
313/292
8,766,282 B2 * 7/2014 Noh ..................... H01L 27/3211
257/79
(Continued)

FOREIGN PATENT DOCUMENTS

CN 1520235 A 8/2004
CN 1577914 A 2/2005
(Continued)

OTHER PUBLICATIONS

Chinese Office Action for Chinese Application No. CN 201710289711.9 dated Aug. 3, 2018.

*Primary Examiner* — William Coleman
(74) *Attorney, Agent, or Firm* — Fay Sharpe LLP

(57) ABSTRACT

A pixel definition structure, an organic light-emitting device and the encapsulation method thereof, and a display apparatus are provided, in the field of display technology. The pixel definition structure includes a plurality of barriers, wherein the plurality of barriers includes a first barrier and a second barrier. The height of the first barrier is smaller than that of the second barrier, and a barrier at a first edge area of the pixel definition structure is the first barrier. The present disclosure can solve the problem of the poor encapsulation effect and improve the encapsulation effect. The present disclosure is applied to an organic light-emitting device.

20 Claims, 4 Drawing Sheets

(52) U.S. Cl.
CPC ........ *H01L 51/56* (2013.01); *H01L 2227/323* (2013.01); *H01L 2251/558* (2013.01)

(56) References Cited

U.S. PATENT DOCUMENTS

| | | | |
|---|---|---|---|
| 9,412,972 B2 * | 8/2016 | Shim | H01L 51/5256 |
| 9,601,714 B2 * | 3/2017 | Hong | H01L 51/5246 |
| 2015/0102295 A1 * | 4/2015 | Hong | H01L 51/5246 |
| | | | 257/40 |
| 2016/0268356 A1 * | 9/2016 | Go | H01L 27/3248 |
| 2016/0365395 A1 * | 12/2016 | Xu | H01L 51/5246 |
| 2017/0110532 A1 * | 4/2017 | Kim | H01L 51/0017 |
| 2018/0033836 A1 * | 2/2018 | Lee | H01L 27/3206 |

FOREIGN PATENT DOCUMENTS

| | | |
|---|---|---|
| CN | 1612648 A | 5/2005 |
| CN | 1662108 A | 8/2005 |
| JP | 2014067543 A | 4/2014 |

\* cited by examiner

PIXEL DEFINITION STRUCTURE, ORGANIC LIGHT-EMITTING DEVICE, ENCAPSULATION METHOD THEREOF, AND DISPLAY APPARATUS

The present application claims priority to Chinese Patent Application No. 201710289711.9, filed with the State Intellectual Property Office and titled "Pixel Definition Structure, Organic Light-Emitting Device, Encapsulation Method thereof, and Display Apparatus", which is incorporated herein by reference in its entirety.

TECHNICAL FIELD

The present disclosure relates to the field of display technology, and more particularly to a pixel definition structure, an organic light-emitting device, an encapsulation method thereof, and a display apparatus.

BACKGROUND

Organic Light-Emitting Diode (OLED) devices are featured by self-light emitting, high brightness, high contrast, low operating voltage, flexible display and so on, and are regarded as the most prospective display devices. However, compositions in the air such as moisture and/or oxygen and so on greatly affect the service life of OLED devices. Thus, OLED devices usually need to be encapsulated to isolate the OLED devices from the air.

In the related art, an OLED device includes a basal substrate and an anode layer, a pixel definition structure (or referred to as a pixel definition layer (PDL)), an organic light-emitting layer and a cathode layer arranged sequentially on the basal substrate. The pixel definition structure includes a plurality of barriers with the same height. The plurality of barriers may define a plurality of pixel regions. The organic light-emitting layer includes a plurality of organic light-emitting units. Each organic light-emitting unit is disposed in one pixel region. When an OLED device is encapsulated, an encapsulation structure may be formed at an outer side of the OLED device. The encapsulation structure includes an organic layer and an inorganic layer alternately laminated on and covering the OLED device. There may be a plurality of organic layers and inorganic layers. The inorganic layer may be formed through an atomic layer deposition (ALD) process. When the inorganic layer is formed through the ALD process, the OLED device may be deposited in a deposition cavity, then a mask plate may be provided in the deposition cavity such that the mask plate is disposed on the OLED device and an opening area of the mask plate corresponds to the OLED device, and a gas phase precursor may be input into the deposition cavity through a gas inlet at one side of the deposition cavity. The gas phase precursor spreads in the deposition cavity and is deposited and attached to the OLED device through the opening area of the mask plate to form an inorganic layer.

During the implementation of the present disclosure, the inventors have found at least the following problems in the related art:

Since the barriers of the pixel definition structure have the same height, when an inorganic layer is formed through the ALD process, the inorganic layer on the OLED device which first contacts the gas phase precursor is relatively thick, causing poor thickness uniformity of the film layers of the OLED device after encapsulation and a poor encapsulation effect.

SUMMARY

The present disclosure provides a pixel definition structure, an organic light-emitting device, an encapsulation method thereof, and a display apparatus, capable of solving the problem that the thickness uniformity of the film layers of the OLED device is poor after encapsulation and the encapsulation effect is poor.

In a first aspect, there is provided a pixel definition structure, including includes a plurality of barriers. The plurality of barriers include at least one first barrier and at least one second barrier. The height of the first barrier is smaller than that of the second barrier, and a barrier at a first edge area of the pixel definition structure is the first barrier.

In some embodiments, the plurality of barriers are arranged from the first edge area along a preset direction at high-low intervals.

In some embodiments, the plurality of barriers include a plurality of second barriers. The plurality of second barriers have the same height, and the at least one first barrier and the plurality of second barriers are arranged sequentially from the first edge area along a preset direction.

In some embodiments, the heights of the plurality of barriers increase sequentially from the first edge area along a preset direction.

In some embodiments, the plurality of barriers are arranged in an array to form at least one first barrier group and at least one second barrier group at intervals one by one along the preset direction. The first barrier group includes m first barriers, the second barrier group includes n second barriers, and a barrier group at the first edge area is the first barrier group, $m \geq 1$, $n \geq 1$ and both m and n are integers.

In some embodiments, $m=1$ and $n=1$.

In some embodiments, the first edge area is an edge area which a gas phase precursor first passes by when an organic light-emitting device including the pixel definition structure is encapsulated.

In some embodiments, the preset direction is a flow direction of a gas phase precursor when an organic light-emitting device including the pixel definition structure is encapsulated.

In a second aspect, there is provided an organic light-emitting device, including a pixel definition structure. The pixel definition structure includes a plurality of barriers. The plurality of barriers include at least one first barrier and at least one second barrier, the height of the first barrier is smaller than that of the second barrier, and a barrier at a first edge area of the pixel definition structure is the first barrier In some embodiments, the plurality of barriers are arranged from the first edge area along a preset direction at high-low intervals.

In some embodiments, the plurality of barriers include a plurality of second barriers. The plurality of second barriers have the same height, and the at least one first barrier and the plurality of second barriers are arranged sequentially from the first edge area along a preset direction.

In some embodiments, the heights of the plurality of barriers increase sequentially from the first edge area along a preset direction.

In some embodiments, the plurality of barriers are arranged in an array to form at least one first barrier group and at least one second barrier group at intervals one by one along the preset direction. The first barrier group includes m first barriers, the second barrier group includes n second barriers, and a barrier group at the first edge area is the first barrier group, $m \geq 1$, $n \geq 1$ and both m and n are integers.

In some embodiments, the first edge area is an edge area which a gas phase precursor first passes by when an organic light-emitting device including the pixel definition structure is encapsulated.

In some embodiments, the preset direction is a flow direction of a gas phase precursor when an organic light-emitting device including the pixel definition structure is encapsulated.

In some embodiments, the organic light-emitting device includes a substrate and an anode layer, the pixel definition structure, an organic light-emitting layer and a cathode layer arranged sequentially on the substrate.

In a third aspect, there is provided a method for encapsulating an organic light-emitting device. The organic light-emitting device includes a pixel definition structure comprising a plurality of barriers. The plurality of barriers include at least one first barrier and at least one second barrier, the height of the first barrier is smaller than that of the second barrier, and a barrier at a first edge area of the pixel definition structure is the first barrier. The method includes:

arranging the organic light-emitting device in a deposition cavity, such that the first edge area of the pixel definition structure of the organic light-emitting device is close to a gas inlet of the deposition cavity;

arranging a mask plate on the organic light-emitting device, such that an opening area of the mask plate corresponds to the organic light-emitting device;

inputting a gas phase precursor into the deposition cavity through the gas inlet, wherein the gas phase precursor is deposited and attached onto the organic light-emitting device through the opening area to form an inorganic layer; and forming an organic layer covering the inorganic layer on an outer side of the inorganic layer.

In a fourth aspect, there is provided a display apparatus, including the organic light-emitting device provided in the second aspect.

In some embodiments, the plurality of barriers are arranged from the first edge area along a preset direction at high-low intervals.

In some embodiments, the plurality of barriers include a plurality of second barriers. The plurality of second barriers have the same height, and the at least one first barrier and the plurality of second barriers are arranged sequentially from the first edge area along a preset direction.

The technical solutions provided by the present disclosure may include the following advantageous benefits:

In the pixel definition structure, the organic light-emitting device, and the encapsulation method thereof, and the display apparatus provided by the embodiments of the present disclosure, since the plurality of barriers of the pixel definition structure includes at least one first barrier and at least one second barrier, a barrier at the first edge area of the pixel definition structure is the first barrier, and the height of the first barrier is smaller than that of the second barrier, the thicknesses of the portions of the film layers at the first edge area after the organic light-emitting device including the pixel definition structure may be reduced, which improves the thickness uniformity of the film layers and improves the encapsulation effect.

It is to be understood that both the foregoing general description and the following detailed description are exemplary and explanatory only and are not intended to limit the present disclosure.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

The drawings herein are incorporated in and constitute a part of this specification of the present disclosure, showing embodiments consistent with the present disclosure, and explaining the principles of the present disclosure together with the specification.

DETAILED DESCRIPTION OF THE EMBODIMENTS

The present disclosure will be described in further detail with reference to the enclosed drawings, to clearly present the objects, technique solutions, and advantages of the present disclosure.

OLED devices are poorly resistant to H2O (water) and/or O2 (oxygen) in the environment, and thus how to effectively block H2O and/or O2 is a main bottleneck of the application of OLED devices.

Currently, thin film encapsulation (TFE) method is a main encapsulation method of OLED devices. The TFE method forms an encapsulation structure by forming an organic layer and an inorganic layer laminated to encapsulate an OLED device. The organic layer and the inorganic layer may be both referred to as encapsulation film layers and this encapsulation structure may also be referred to as a blocking layer.

The ALD process may realize different reaction periods in a sequential and quantitive reaction manner, to form a smooth, continuous and non-defective film by means of atomic scale precise control. Thus, in the TFE method, a better inorganic layer is usually obtained through the ALD process to improve the encapsulation performance of the encapsulation structure. However, the deposition of the ALD process is atomic scale deposition and barriers of a pixel definition structure of an OLED device have the same height. After the inorganic layer is formed through the ALD process, the OLED device has a severe shadow effect phenomenon. The shadow effect phenomenon is greatly related to the flow direction of a gas phase precursor.

Exemplarily, the shadow effect phenomenon at a location close to the gas phase precursor on the OLED device is more severe. The shadow effect phenomenon will cause the film layers to be non-uniform and then affect the final encapsulation effect.

In the embodiments of the present disclosure, the barriers of the pixel definition structure of the organic light-emitting device are arranged as barriers with different heights and the heights of the barriers close to the gas phase precursor are lower, such that the resistance to the gas phase precursor in the flow direction may be reduced, to reduce the shadow effect phenomenon at the edge of the organic light-emitting device. Thus, the property of the encapsulation film layers may be guaranteed, and the waterproof property of the encapsulation film layers may be improved.

Figure 1:
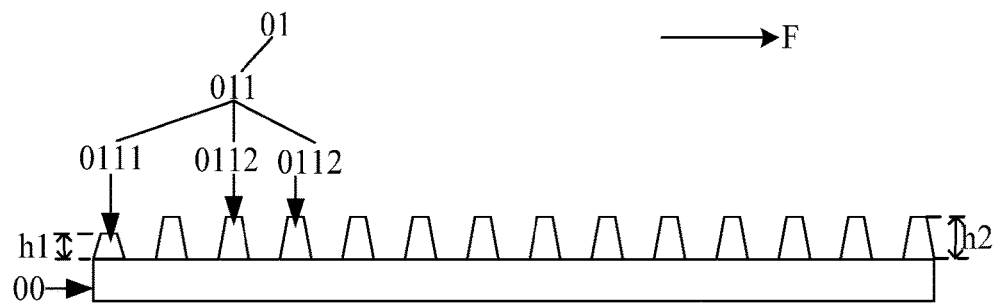
FIG. 1 is a schematic diagram of a pixel definition structure provided by an embodiment of the present disclosure.
Figure 2:
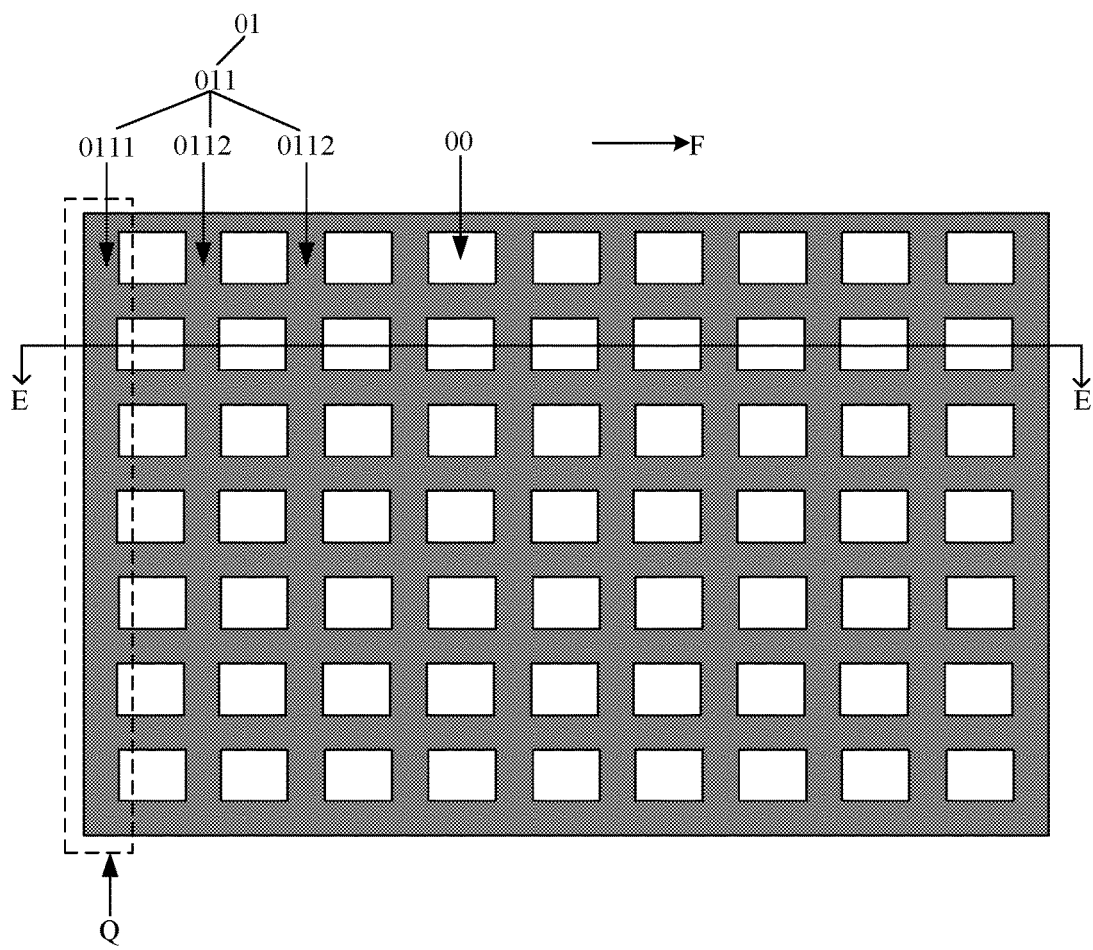
FIG. 2 is a top view of a pixel definition structure provided by an embodiment of the present disclosure.

Referring to FIGS. 1 and 2, FIG. 1 shows a schematic diagram of a pixel definition structure 01 provided by the embodiments of the present disclosure. FIG. 2 shows a top view of the pixel definition structure 01 provided by the embodiments of the present disclosure. FIG. 1 may be a section view of part E-E in FIG. 2. In combination with FIGS. 1 and 2, the pixel definition structure 01 includes a plurality of barriers 011. The plurality of barriers 011 include at least one first barrier 0111 and at least one second barrier 0112. The height h1 of the first barrier 0111 is smaller than the height h2 of the second barrier 0112. A barrier at a first edge area Q of the pixel definition structure 01 is the first barrier 0111.

The pixel definition structure 01 includes a bottom surface (not shown in FIG. 1). The bottom surface of the pixel definition structure 01 may be planar. The height of any of the first barrier 0111 and the second barrier 0112 is the height of this barrier relative to the bottom surface of the pixel definition structure 01. For example, the height of the first barrier 0111 is the height of the first barrier 0111 relative to the bottom surface of the pixel definition structure 01. The height of the second barrier 0112 is the height of the second barrier 0112 relative to the bottom surface of the pixel definition structure 01. As shown in FIGS. 1 and 2, in practice, the pixel definition structure 01 may be formed on a basal substrate 00. The bottom surface of the pixel definition structure 01 and the upper surface of the basal substrate 00 (not shown in FIGS. 1 and 2) are coplanar. The height of any of the first barrier 0111 and the second barrier 0112 is the height of this barrier relative to the upper surface of the basal substrate 00. The basal substrate 00 may be a transparent one, which may specifically be a rigid substrate made of a light-guiding and non-metal material with certain rigidity such as glass, quartz or transparent resin. Alternatively, the basal substrate 00 may be a flexible one made of a material such as polyimide (PI).

In summary, in the pixel definition structure provided by the embodiments of the present disclosure, since the plurality of barriers of the pixel definition structure include at least one first barrier and at least one second barrier, the barrier at a first edge area of the pixel definition structure is the first barrier, and the height of the first barrier is smaller than that of the second barrier, the thicknesses of the portions of the film layers after an organic light-emitting device including the pixel definition structure is encapsulated may be reduced, which facilitates improving the thickness uniformity of the film layers and improves the encapsulation effect.

In some embodiments, as shown in FIGS. 1 and 2, the plurality of barriers 011 include one first barrier 0111 and a plurality of second barriers 0112. The plurality of second barriers 0112 may have the same height. The first barrier 0111 and the plurality of second barriers 0112 are arranged sequentially from the first edge area Q along a preset direction. It should be noted that the FIGS. 1 and 2 are exemplified with the pixel definition structure 01 including one first barrier 0111. In practice, there may be one or a plurality of first barriers 0111. Similarly, there may be one or a plurality of second barriers 0112, which is not limited in the embodiments of the present disclosure.

Figure 3:
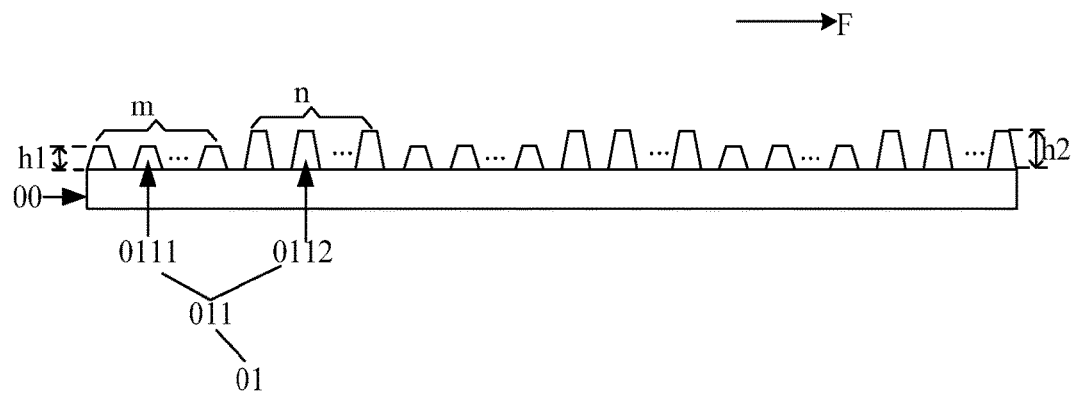
FIG. 3 is a schematic diagram of another pixel definition structure provided by an embodiment of the present disclosure.
Figure 4:
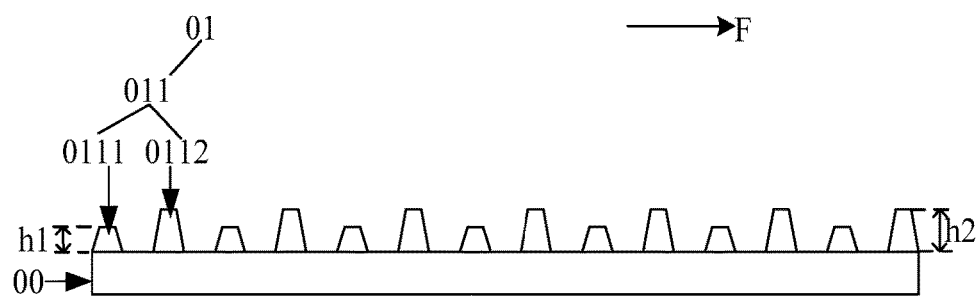
FIG. 4 is a schematic diagram of yet another pixel definition structure provided by an embodiment of the present disclosure.

In some embodiments, referring to FIG. 3, which shows a schematic diagram of another pixel definition structure 01 provided by the embodiments of the present disclosure. Referring to FIG. 3, the plurality of barriers 011 are arranged from the first edge area (not shown in FIG. 3) of the pixel definition structure 01 along a preset direction F at high-low intervals. In some embodiments, as shown in FIG. 3, the plurality of barriers 011 are arranged in an array to form at least one first barrier group (not shown in FIG. 3) and at least one second barrier group (not shown in FIG. 3) at intervals one by one along the preset direction F. The first barrier group includes m first barriers 0111, the second barrier group includes n second barriers 0112, and the barrier group at the first edge area of the pixel definition structure 01 is the first barrier group. $m \geq 1$, $n \geq 1$ and both m and n are integers. In some embodiments, as shown in FIG. 4, m=1 and n=1. It should be noted that the present embodiment is illustrated by taking an example in which m=1 and n=1. In practice, the values of m and n may be set based on actual needs and is not limited in the embodiments of the present disclosure.

Figure 5:
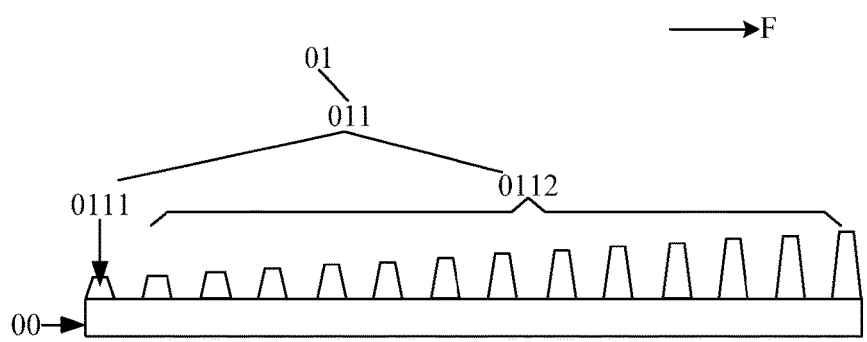
FIG. 5 is a schematic diagram of yet another pixel definition structure provided by an embodiment of the present disclosure.

In some embodiments, referring to FIG. 5, a schematic diagram of a yet another pixel definition structure 01 provided by the embodiments of the present disclosure is shown. With reference to FIG. 5, the heights of the plurality of barriers 011 increase sequentially from the first edge area (not shown in FIG. 5) along a preset direction F. For example, the heights of the plurality of barriers 011 increase linearly from the first edge area along the preset direction F. Alternatively, the heights of the plurality of barriers 011 increase non-linearly from the first edge area along the preset direction F. In some embodiments, as shown in FIG. 5, the plurality of barriers 011 include one first barrier 0111 and a plurality of second barriers 0112. The height of the first barrier 0111 is smaller than that of the second barrier 0112. The heights of the plurality of second barriers 0112 increase sequentially along the preset direction F. It should be noted that FIG. 4 is merely exemplary. In practice, the plurality of barriers 011 may not be divided into the first barrier 0111 and the second barriers 0112, as long as it can be ensured that the heights of the plurality of barriers 011 increase sequentially from the first edge area along the preset direction F, which is not limited in the embodiments of the present disclosure.

In some embodiments, in the present disclosure, the first edge area of the pixel definition structure 01 is an edge area which a gas phase precursor first passes by when an organic light-emitting device (not shown from FIG. 1 to FIG. 5) including the pixel definition structure 01 is encapsulated. The preset direction is the flow direction of the gas phase precursor when the organic light-emitting device including the pixel definition structure 01 is encapsulated. The pixel definition structure may be formed by an insulating material, such as resin through a patterning process, which is not limited in the embodiments of the present disclosure.

It should be noted that the present disclosure merely shown the top view of the pixel definition structure 01 shown in FIG. 1. The top view of the pixel definition structure 01 shown in FIG. 3 to FIG. 5 may be referenced to FIG. 2, which is not limited in the embodiments of the present disclosure.

In summary, in the pixel definition structure provided by the embodiments of the present disclosure, since the plurality of barriers of the pixel definition structure include at least one first barrier and at least one second barrier, the barrier at a first edge area of the pixel definition structure is the first barrier, and the height of the first barrier is smaller than that of the second barrier, thicknesses of the portions of the film layers after an organic light-emitting device including the pixel definition structure is encapsulated may be reduced, which facilitates improving the thickness uniformity of the film layers and improves the encapsulation effect.

Figure 6:
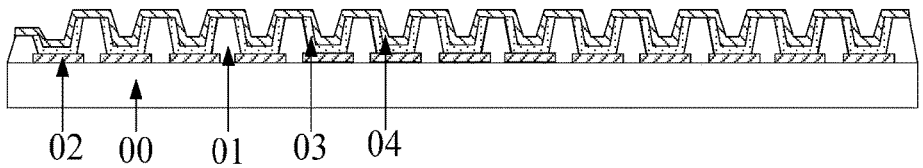
FIG. 6 is a structural schematic diagram of a light-emitting device provided by an embodiment of the present disclosure.

The embodiments of the present disclosure further provide an organic light-emitting device. The organic light-emitting device may be an OLED device and may include the pixel definition structure 01 shown in any of FIG. 1 to FIG. 5. As shown in FIG. 6, the present disclosure is illustrated by taking an example in which the organic light-emitting device 0 includes the pixel definition structure 01 shown in FIG. 1.

In some embodiments, referring to FIG. 6, the organic light-emitting device 0 includes a basal substrate 00 and an anode layer 02, the pixel definition structure 01, an organic light-emitting layer 03 and a cathode layer 04 arranged sequentially on the basal substrate.

The basal substrate 00 may be a transparent one, which may specifically be a rigid substrate made of a light-guiding and non-metal material with certain rigidity such as glass, quartz or transparent resin. Alternatively, the basal substrate 00 may be a flexible one made of a material such as PI. When the basal substrate 00 is a flexible one, in order to facilitate the production of the organic light-emitting device 0, the basal substrate 00 may be arranged on a rigid substrate and the rigid substrate may be peeled off after the organic light-emitting device 0 is produced.

As shown in FIG. 6, the anode layer 02 may include a plurality of anode structures (not shown in FIG. 6). The anode layer 02 may be made of metal oxide such as indium tin oxide (ITO) or indium zinc oxide (IZO) through one-time patterning process. The barriers of the pixel definition structure 01 may define a plurality of pixel regions. The organic light-emitting layer 03 may include a plurality of organic light-emitting units (not shown in FIG. 6). One organic light-emitting unit is provided in each pixel region. In the embodiments of the present disclosure, the plurality of organic light-emitting units may include a red light-emitting unit, a green light-emitting unit, a blue light-emitting unit and so on. The red light-emitting unit may be made of a red organic light-emitting material through one-time patterning process. The green light-emitting unit may be made of a green organic light-emitting material through one-time patterning process. The blue light-emitting unit may be made of a blue organic light-emitting material through one-time patterning process. Of course, in practice, the plurality of organic light-emitting units may include other colored light-emitting units. For example, the plurality of organic light-emitting units may include a yellow light-emitting unit, a red light-emitting unit, a cyan light-emitting unit, a black light-emitting unit and so on, which will not be described anymore in the embodiment of the present disclosure. The production material of the cathode layer 04 may be the same as or different from the production material of the anode layer 02. For example, the cathode layer 04 and the anode layer 02 may be both made of ITO. Alternatively, one of the cathode layer 04 and the anode layer 02 may be made of ITO and the other may be made of IZO, which is not limited in the embodiments of the present disclosure.

It should be noted that the organic light-emitting device shown in FIG. 6 is merely exemplary. In practice, the organic light-emitting device may also include a thin film transistor (TFT), a hole transport layer, an electron transport layer and so on. The position relationships among the layers and the formation methods and formation materials of the layers may be made reference to the related art, which will not be described anymore in the embodiments of the present disclosure.

It should also be noted that the embodiments of the present disclosure is described by taking an example in which the organic light-emitting device 0 includes the pixel definition structure 01 shown in FIG. 1. When the organic light-emitting device 0 includes the pixel definition structure 01 shown in any of FIGS. 3 to 5, the structure of the organic light-emitting device 0 may be made reference to this embodiment, which will be described here anymore.

In summary, in the organic light-emitting device provided by the embodiments of the present disclosure, since the plurality of barriers of the pixel definition structure include at least one first barrier and at least one second barrier, the barrier at a first edge area of the pixel definition structure is the first barrier, and the height of the first barrier is smaller than that of the second barrier, the thicknesses of the portions of the film layers after an organic light-emitting device including the pixel definition structure is encapsulated may be reduced, which facilitates improving the thickness uniformity of the film layers and improves the encapsulation effect.

The organic light-emitting device provided by the embodiments of the present disclosure may be applied to the encapsulation method below and the encapsulation method of the organic light-emitting device in the present embodiment may be referenced to the description.

Figure 7:
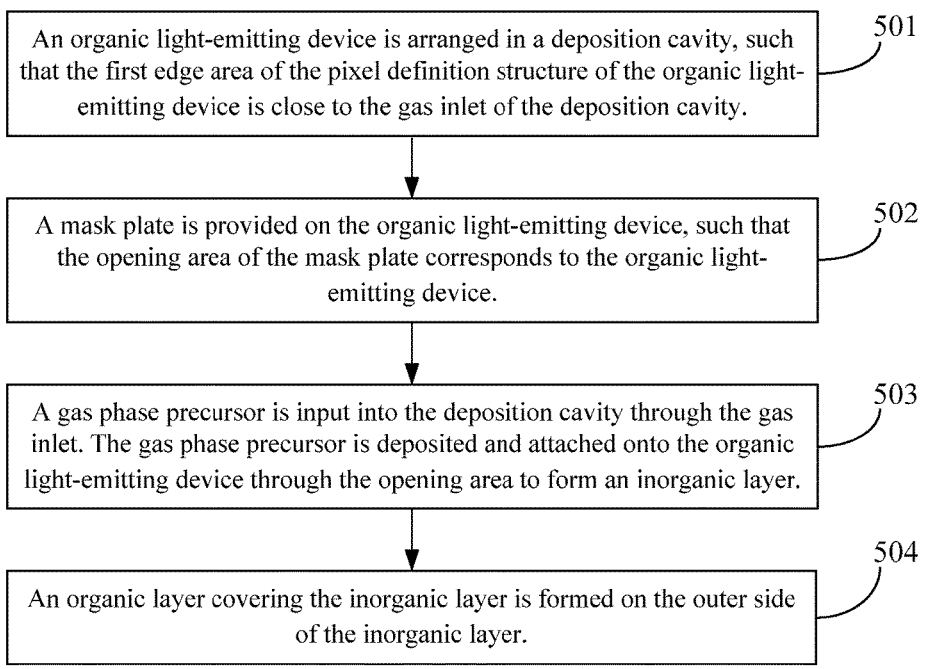
FIG. 7 is a flow chart of an encapsulation method provided by an embodiment of the present disclosure.

Referring to FIG. 7, which illustrates a flow chart of an encapsulation method provided by the embodiments of the present disclosure. The encapsulation method may be applied to encapsulate the organic light-emitting device including the pixel definition structure 01 shown in any of FIG. 1 to FIG. 5. The present disclosure is illustrated by taking an example in which the organic light-emitting device 0 shown in FIG. 6 is encapsulated. Referring to FIG. 7, the method includes:

At step 501, the organic light-emitting device is arranged in a deposition cavity, such that the first edge area of the pixel definition structure of the organic light-emitting device is close to the gas inlet of the deposition cavity.

Figure 8:
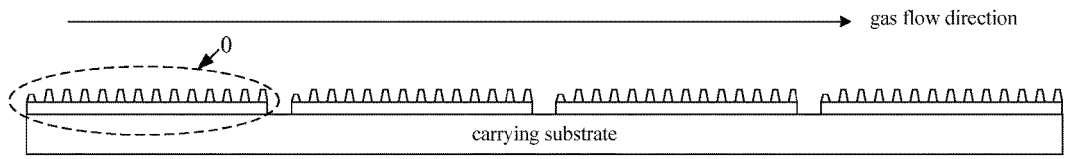
FIG. 8 is a diagram of an arrangement of a plurality of light-emitting devices on a carrying substrate provided by an embodiment of the present disclosure.
Figure 9:
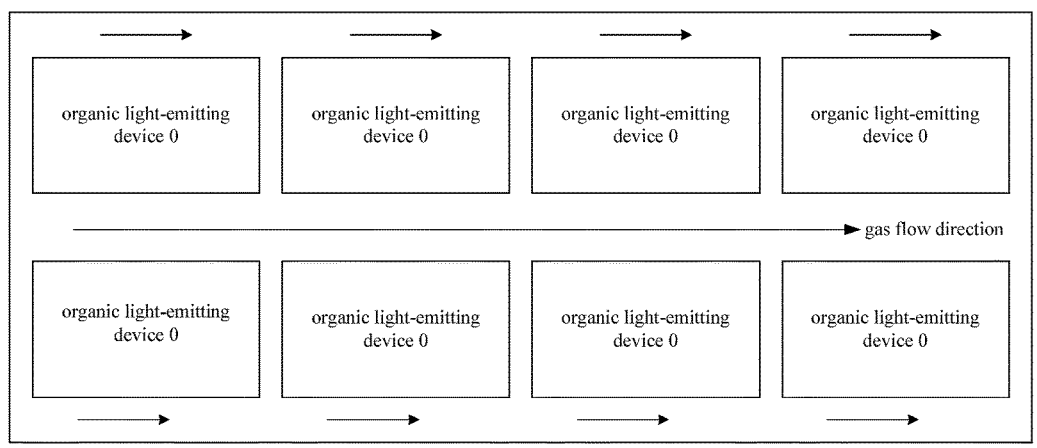
FIG. 9 is a top view of FIG. 8.

In some embodiments, a carrying platform may be provided in the deposition cavity, and the organic light-emitting device may be provided on the carrying platform, such that the first edge area of the pixel definition structure of the organic light-emitting device is close to the gas inlet of the deposition cavity. In practice, a plurality of organic light-emitting devices may be encapsulated simultaneously. Here, at step 501, each organic light-emitting device may be provided on the carrying platform by means of the basal substrate of each organic light-emitting device, such that the first edge area of the pixel definition structure of each organic light-emitting device is close to the gas inlet of the deposition cavity. Alternatively, all organic light-emitting devices may be provided on the same carrying substrate, such that all organic light-emitting devices may be arranged in the manner shown in FIG. 8. Then, the carrying substrate provided with organic light-emitting devices shown in FIG. 8 is provided on the carrying platform, such that the first edge area of the pixel definition structure of any organic light-emitting device is close to the gas inlet of the deposition cavity, thus the first edge areas of the pixel definition structures of all organic light-emitting devices are close to the gas inlet of the deposition cavity. The top view of FIG. 8 may be as shown in FIG. 9. It can be seen from FIG. 9 that the carrying substrate is provided with 8 organic light-emitting devices 0.

It should be noted that FIG. 8 is described by taking the organic light-emitting device 0 shown in FIG. 6 as an example. When the organic light-emitting device is an organic light-emitting device which includes the pixel definition structure shown in any of FIGS. 3 to 5, the arrangement manner of the organic light-emitting device on the carrying substrate may be made reference to FIG. 8. FIGS. 8 and 9 do not show the detailed structure diagrams of the organic light-emitting device 0. The detailed structure diagram of the organic light-emitting device 0 may be made reference to FIG. 6, which will not be described anymore in the embodiments of the present disclosure.

At step 502, a mask plate is provided on the organic light-emitting device, such that the opening area of the mask plate corresponds to the organic light-emitting device.

At least one opening area is provided on the mask plate. When one opening area is provided on the mask plate, the mask plate may be provided on one organic light-emitting device, such that the opening area of the mask plate corresponds to the organic light-emitting device. In some embodiments, when a plurality of organic light-emitting devices are encapsulated simultaneously, a plurality of opening areas are provided on the mask plate. The mask plate may be provided on a plurality of organic light-emitting devices, such that the plurality of opening areas of the mask plate correspond to the plurality of organic light-emitting devices one by one. When the mask plate is provided, the mask plate may be attached to the organic light-emitting device.

Exemplarily, the mask plate may be provided as shown in FIG. 8, such that the opening areas of the mask plate correspond to 8 organic light-emitting devices 0 shown in FIG. 8 one by one. The description about the provision of the mask plate may be made reference to the related art and will not be described anymore in the embodiments of the present disclosure.

At step 503, a gas phase precursor is input into the deposition cavity through the gas inlet. The gas phase precursor is deposited and attached onto the organic light-emitting device through the opening area to form an inorganic layer.

In some embodiments, the gas inlet may be connected to a gas phase precursor source. The gas inlet may be opened to let the gas phase precursor in the gas phase precursor source enter the deposition cavity. Then, the gas phase precursor spreads in the deposition cavity along the gas flow directions (i.e. the flow direction of the gas phase precursor) shown in FIGS. 8 and 9 and passes above the organic light-emitting device, during which the gas phase precursor may be deposited and attached on the organic light-emitting device through the opening area of the mask plate to form an inorganic layer. In the embodiments of the present disclosure, the gas phase precursor may be Aluminium Oxide (Al2O3). Of course, in practice, the gas phase precursor may also be other gases, which is not limited in the embodiments of the present disclosure.

It should be noted that in FIGS. 8 and 9, since the heights of the barriers at the first edge area of the pixel definition structure of each organic light-emitting device are relatively low and the first edge area of the pixel definition structure is close to the gas inlet, the gas phase precursor first passes by the first edge area and then is deposited on a corresponding area on the organic light-emitting device and forms an inorganic layer, realizing a better uniformity of the organic layer eventually formed and improving the encapsulation effect. It should also be noted that the above steps 501 to 503 are actually a process of forming the inorganic layer through an ALD process. The implementation of the ALD process may be made reference to the related art, which will not be described anymore in the embodiments of the present disclosure.

It should be noted that in the embodiments of the present disclosure, the pixel definition structure includes barriers with different heights and the heights of the barriers at the first edge area of the pixel definition structure are relatively low, such that the resistance to the gas phase precursor along the flow direction may be reduced and the standing time of the gas phase precursor at the first edge area of the organic light-emitting device (the first edge area of the organic light-emitting device is the corresponding area of the first edge area of the pixel definition structure on the organic light-emitting device) may be shortened, thus reducing the shadow effect phenomenon at the edge of the organic light-emitting device. Furthermore, when the barriers of the pixel definition structure of the organic light-emitting device are arranged in the manner shown in FIG. 4 and when the organic light-emitting device is encapsulated, the time that it takes for the gas phase precursor to pass by each pixel region may be equal, which can ensure the property of the deposited film layers and improves the waterproof property of the encapsulation film.

At step 504, an organic layer covering the inorganic layer is formed on the outer side of the inorganic layer.

In some embodiments, the organic layer covering the inorganic layer may be formed on the outer side of the inorganic layer through an ink-jet printing (IJP) process. The detailed formation process may be made reference to the related art, which is not limited in the embodiments of the present disclosure.

It should be noted that the encapsulation method provided by the embodiments of the present disclosure is described by taking forming an organic layer and an inorganic layer on the outer side of the organic light-emitting device as an example. In practice, a plurality of film layers may be formed on the outer side of the organic light-emitting device. The plurality of film layers include inorganic layers and organic layers laminated alternately. Film layers contacting the organic light-emitting device and the film layers furthest away from the organic light-emitting device among the plurality of film layers may be inorganic layers. The formation method of each inorganic layer may be made reference to the above step 503. The formation method of each organic layer may be made reference to the above step 504. That is, the above steps 503 to 504 may be performed repeatedly to form inorganic layers and organic layers laminated alternately to obtain an encapsulation structure and to complete the encapsulation of the organic light-emitting device. Generally, the plurality of film layers may be 3 film layers. In addition, a barrier layer may be provided at the outer side of the film layers furthest away from the organic light-emitting device, and a cover plate may be provided on the barrier layer. Generally, the barrier layer may be made of silicon oxide or silicon nitride, and the cover plate may be a transparent substrate, which may be a rigid substrate made of a light-guiding and non-metal material with certain rigidity such as glass, quartz or transparent resin. Alternatively, the cover plate may be a flexible substrate. The cover plate may be a flexible substrate made of PI. It may facilitate the flexible display when the cover plate is a flexible substrate.

In the embodiments of the present disclosure, since the pixel definition structure includes barriers with different heights and the heights of the barriers at the first edge area of the pixel definition structure are relatively low, the gas flow stability of the gas phase precursor during the ALD process may be improved, and the mask shadow phenomenon caused by different flow directions of the gas phase precursor may be reduced, thereby improving the stability of the inorganic layer formed through the ALD process and improving the encapsulation property of the display device.

In summary, an encapsulation method is provided by the embodiments of the present disclosure. The plurality of barriers of the pixel definition structure include at least one first barrier and at least one second barrier. The barrier at a first edge area of the pixel definition structure is the first barrier, and the height of the first barrier is smaller than that of the second barrier. Therefore, the thicknesses of the portions of the film layers after an organic light-emitting device including the pixel definition structure is encapsulated may be reduced, which facilitates improving the thickness uniformity of the film layers and improves the encapsulation effect.

The embodiments of the present disclosure further provide a display apparatus, including an organic light-emitting device. The organic light-emitting device may further include the pixel definition structure 01 shown in any of FIGS. 1 to 5, and may be an OLED device. For example, the organic light-emitting device may be the organic light-emitting device 0 shown in FIG. 6.

In some embodiments, the display apparatus may be a mobile phone, a tablet computer, a television, a display, a laptop computer, a digital photo frame, a navigator or any other product or part with display function.

The term "and/or" herein describes the correspondence of the corresponding objects, indicating three kinds of relationship. For example, A and/or B, can be expressed as: A exists alone, A and B exist concurrently, B exists alone. Additionally, the character "/" generally indicates that the context object is an "OR" relationship.

Persons of ordinary skill in the art can understand that all or part of the steps described in the above embodiments can be completed through hardware, or through relevant hardware instructed by applications stored in a non-transitory computer readable storage medium, such as read-only memory, disk or CD, etc.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A pixel definition structure, comprising a plurality of barriers, wherein the plurality of barriers include at least one first barrier and at least one second barrier, the height of the first barrier is substantially smaller than that of the second barrier, and a barrier at a first edge area of the pixel definition structure is the first barrier.

2. The pixel definition structure according to claim 1, wherein the plurality of barriers are arranged from the first edge area along a preset direction at high-low intervals.

3. The pixel definition structure according to claim 1, wherein the plurality of barriers include a plurality of second barriers, the plurality of second barriers have the same height, and the at least one first barrier and the plurality of second barriers are arranged sequentially from the first edge area along a preset direction.

4. The pixel definition structure according to claim 1, wherein the heights of the plurality of barriers increase sequentially from the first edge area along a preset direction.

5. The pixel definition structure according to claim 2, wherein the plurality of barriers are arranged in an array to form at least one first barrier group and at least one second barrier group at intervals one by one along the preset direction, the first barrier group includes m first barriers, the second barrier group includes n second barriers, and a barrier group at the first edge area is the first barrier group, $m \geq 1$, $n \geq 1$ and both m and n being integers.

6. The pixel definition structure according to claim 5, wherein $m=1$ and $n=1$.

7. The pixel definition structure according to claim 1, wherein the first edge area is an edge area which a gas phase precursor first passes by when an organic light-emitting device including the pixel definition structure is encapsulated.

8. The pixel definition structure according to claim 2, wherein the preset direction is a flow direction of a gas phase precursor when an organic light-emitting device including the pixel definition structure is encapsulated.

9. An organic light-emitting device, comprising a pixel definition structure,
wherein the pixel definition structure includes a plurality of barriers, the plurality of barriers include at least one first barrier and at least one second barrier, the height of the first barrier is substantially smaller than that of the second barrier, and a barrier at a first edge area of the pixel definition structure is the first barrier.

10. The organic light-emitting device according to claim 9, wherein the plurality of barriers are arranged from the first edge area along a preset direction at high-low intervals.

11. The organic light-emitting device according to claim 9, wherein the plurality of barriers include a plurality of second barriers, the plurality of second barriers have the same height, and the at least one first barrier and the plurality of second barriers are arranged sequentially from the first edge area along a preset direction.

12. The organic light-emitting device according to claim 9, wherein the heights of the plurality of barriers increase sequentially from the first edge area along a preset direction.

13. The organic light-emitting device according to claim 9, wherein the plurality of barriers are arranged in an array to form at least one first barrier group and at least one second barrier group at intervals one by one along the preset direction, the first barrier group includes m first barriers, the second barrier group includes n second barriers, and a barrier group at the first edge area is the first barrier group, $m \geq 1$, $n \geq 1$ and both m and n being integers.

14. The organic light-emitting device according to claim 9, wherein the first edge area is an edge area which a gas phase precursor first passes by when an organic light-emitting device including the pixel definition structure is encapsulated.

15. The organic light-emitting device according to claim 10, wherein the preset direction is a flow direction of a gas phase precursor when an organic light-emitting device including the pixel definition structure is encapsulated.

16. The organic light-emitting device according to claim 9, wherein the organic light-emitting device includes a basal substrate and an anode layer, the pixel definition structure, an organic light-emitting layer and a cathode layer arranged sequentially on the basal substrate.

17. A method for encapsulating an organic light-emitting device, wherein the organic light-emitting device includes a pixel definition structure, the pixel definition structure includes a plurality of barriers, the plurality of barriers include at least one first barrier and at least one second barrier, the height of the first barrier is substantially smaller than that of the second barrier, and a barrier at a first edge area of the pixel definition structure is the first barrier, and the method comprises:

arranging the organic light-emitting device in a deposition cavity, such that the first edge area of the pixel definition structure of the organic light-emitting device is close to a gas inlet of the deposition cavity;

arranging a mask plate on the organic light-emitting device, such that an opening area of the mask plate corresponds to the organic light-emitting device;

inputting a gas phase precursor into the deposition cavity through the gas inlet, wherein the gas phase precursor passes through the opening area and is deposited and attached onto the organic light-emitting device to form an inorganic layer; and forming an organic layer covering the inorganic layer on an outer side of the inorganic layer.

18. A display apparatus, comprising the organic light-emitting device of claim 9.

19. The display apparatus according to claim 18, wherein the plurality of barriers are arranged from the first edge area along a preset direction at high-low intervals.

20. The display apparatus according to claim 18, wherein the plurality of barriers include a plurality of second barriers, the plurality of second barriers have the same height, and the at least one first barrier and the plurality of second barriers are arranged sequentially from the first edge area along a preset direction.

\* \* \* \* \*